US010176737B2

(12) United States Patent
Zhou

(10) Patent No.: US 10,176,737 B2
(45) Date of Patent: Jan. 8, 2019

(54) ARRAY SUBSTRATE, AND DISPLAY PANEL AND TEST METHOD THEREFOR

(71) Applicant: Xiamen Tianma Micro-Electronics Co., Ltd., Xiamen (CN)

(72) Inventor: Hongbo Zhou, Xiamen (CN)

(73) Assignee: XIAMEN TIANMA MICRO-ELECTRONICS CO., LTD., Xiamen (CN)

(*) Notice: Subject to any disclaimer, the term of this patent is extended or adjusted under 35 U.S.C. 154(b) by 0 days.

(21) Appl. No.: 15/880,489

(22) Filed: Jan. 25, 2018

(65) Prior Publication Data
US 2018/0151100 A1 May 31, 2018

(30) Foreign Application Priority Data

May 27, 2017 (CN) .......................... 2017 1 0388171

(51) Int. Cl.
H01R 9/00 (2006.01)
G09G 3/00 (2006.01)
H05K 5/00 (2006.01)
G01R 31/28 (2006.01)
H05K 1/02 (2006.01)
H05K 1/11 (2006.01)
H05K 3/36 (2006.01)

(52) U.S. Cl.
CPC .......... G09G 3/006 (2013.01); G01R 31/282 (2013.01); G01R 31/2808 (2013.01); H05K 1/0268 (2013.01); H05K 1/0296 (2013.01); H05K 1/111 (2013.01); H05K 5/0017 (2013.01); H05K 3/361 (2013.01); H05K 2201/09709 (2013.01); H05K 2201/10128 (2013.01)

(58) Field of Classification Search
CPC .. G01R 31/2808; G01R 31/282; G09G 3/006; H05K 1/0296; H05K 1/111; H05K 5/0017
See application file for complete search history.

(56) References Cited

U.S. PATENT DOCUMENTS

| 7,580,107 B2 * | 8/2009 | Moon | G02F 1/1345 349/192 |
| 2009/0294771 A1 * | 12/2009 | Kim | G02F 1/136204 257/59 |
| 2011/0233617 A1 * | 9/2011 | Or-Bach | H01L 21/76254 257/202 |

(Continued)

FOREIGN PATENT DOCUMENTS

CN 106154664 A 11/2016

Primary Examiner — Yuriy Semenenko
(74) Attorney, Agent, or Firm — Alston & Bird LLP

(57) ABSTRACT

An array substrate, and a display panel and a test method therefor are provided. The array substrate includes a plurality of display signal lines disposed in a display area, and a plurality of first pads and a plurality of second pads disposed in a peripheral area around the display area and electrically connected to the respective plurality of display signal lines. A first test area and a second test area are disposed in a first direction on two sides of a primary area respectively. The first pad includes a first primary part and the second pad includes a second primary part. The first primary parts and the second primary parts are disposed in the primary area and are disposed alternately in a second direction.

19 Claims, 8 Drawing Sheets

(56) References Cited

U.S. PATENT DOCUMENTS

| | | | |
|---|---|---|---|
| 2012/0162165 A1* | 6/2012 | Lee | G09G 3/006 |
| | | | 345/206 |
| 2016/0018711 A1* | 1/2016 | Chen | G02F 1/13452 |
| | | | 345/87 |
| 2017/0263165 A1* | 9/2017 | Guo | G02F 1/1309 |
| 2018/0069067 A1* | 3/2018 | Oh | H01L 27/3262 |
| 2018/0211976 A1* | 7/2018 | Long | H01L 27/124 |
| 2018/0212015 A1* | 7/2018 | Chen | H01L 27/3276 |

* cited by examiner

ARRAY SUBSTRATE, AND DISPLAY PANEL AND TEST METHOD THEREFOR

CROSS-REFERENCES TO RELATED APPLICATIONS

This application claims priority to Chinese patent application No. CN201710388171.x, filed on May 27, 2017, the disclosure of which is incorporated herein by reference in its entirety.

TECHNICAL FIELD

Embodiments of the present disclosure relate to display techniques, and, in particular, to an array substrate, and a display panel and a test method therefor.

BACKGROUND

Before completing manufacturing, a display panel is subject to visual testing (VT) aimed to determine whether the display panel is working properly.

FIG. 1 is a structural diagram of a display panel in the related art. Referring to FIG. 1, the display panel includes a display area 100 provided with a plurality of data signal lines 101, and a non-display area 200 provided with a plurality of display pads 400. Each of the display pads 400 is connected to the respective data signal line 101 (specific connections are not illustrated). The display panel further includes a VT circuit 300 including a plurality of thin film transistors 301, a DO signal line, a DE signal line and an SW signal line. The odd-numbered data signal lines 101 are connected to the DO signal line through the thin film transistors 301. The even-numbered data signal lines 101 are connected to the DE signal line through the thin film transistors 301. Gate electrodes of the thin film transistors 301 are connected to the SW signal line. When the display panel is subject to the visual testing, through test pads 302, a control signal is supplied to the SW signal line and display signals are supplied to the DO signal line and the DE signal line. The SW signal line enables the thin film transistor 301 to turn on. The odd-numbered data signal lines 101 are charged through the DO signal line. The even-numbered data signal lines 101 are charged through the DE signal line. VT is performed thereof.

The VT circuit is complex and occupies much space in the non-display area 200, so it is difficult to manufacture a narrow lower non-display border for the display panel. Due to restricted space in the lower border area of the display panel, components in the VT circuit are made in small sizes and the data signal lines by the supplied display signals lead to insufficient VT charging capacity, resulting in c color mixing during display. Thus quality of the display panel cannot be tested effectively. Moreover, as a large number of components are connected to the DO signal line and the DE signal line, ESD (Electro-Static Discharge) shocks and damages tend to occur in the manufacturing process.

SUMMARY

The present disclosure provides an array substrate, and a display panel and a test method therefor to solve problems during visual testing and to achieve a narrow lower border in non-display area for the display panel.

In a first aspect, an embodiment of the present disclosure provides an array substrate including a plurality of display signal lines disposed in a display area, and a plurality of first pads and a plurality of second pads disposed in a peripheral area around the display area and electrically connected to the respective plurality of display signal lines.

The peripheral area includes a primary area, a first test area and a second test area. The first test area and the second test area are disposed on two sides of the primary area along a first direction respectively. Each of the plurality of first pads comprises a first primary part and each of the plurality of second pads comprises a second primary part, first primary parts of the plurality of first pads and second primary parts of the plurality of second pads are disposed in the primary area and are arranged alternately in a second direction perpendicular to the first direction.

Each of at least one of the plurality of first pads further comprises a first test part disposed in one of the first test area and the second test area.

Alternatively, each of at least one of the plurality of second pads further comprises a second test part disposed in one of the first test area and the second test area.

Alternatively, each of at least one of the plurality of first pads further comprises a first test part disposed in the first test area, and each of at least one of the plurality of second pads further comprises a second test part disposed in the second test area.

In a second aspect, an embodiment of the present disclosure provides a display panel including the array substrate of any embodiment of the present disclosure.

In a third aspect, an embodiment of the present disclosure provides a test method for a display panel. The display panel includes an array substrate including a plurality of display signal lines, a plurality of first pads and a plurality of second pads.

The plurality of display signal lines are disposed in a display area.

The plurality of first pads and the plurality of second pads are disposed in a peripheral area around the display area and are electrically connected to the respective plurality of display signal lines.

The peripheral area includes a primary area, a first test area and a second test area. The first test area and the second test area are disposed in a first direction on two sides of the primary area respectively. Each of the plurality of first pads includes a first primary part and each of the plurality of second pads includes a second primary part, the first primary parts and the second primary parts are disposed in the primary area and are disposed alternately in a second direction, and the first direction is perpendicular to the second direction.

At least one of the plurality of first pads further includes a first test part and the first test part is disposed in the first test area and/or the second test area.

Alternatively, at least one of the plurality of second pads further includes a second test part and the second test part is disposed in the first test area and/or the second test area.

Alternatively, at least one of the plurality of first pads further includes a first test part, at least one of at least part of the plurality of second pads further includes a second test part, the first test part is disposed in the first test area and the second test part is disposed in the second test area.

The test method includes: transmitting test signals to display signal lines which are connected to the plurality of first pads through the first test parts, and transmitting test signals to display signal lines which are connected to the plurality of second pads through the second test parts.

In technical solutions provided by embodiments of the present disclosure, structures of the first pads and the second pads are redesigned, and the visual testing of the display panel formed of the array substrate can be carried out simply through the first test parts of the first pads and the second test parts of the second pads. No DO signal line, DE signal line, SW signal line or thin film transistors are designed, i.e., the no VT circuit is disposed on the array substrate, so the circuit is omitted and power consumption is reduced. Space occupied by the VT circuit on the display panel is saved and a narrow lower border is achieved for the display panel. Insufficient driving capacity of the VT circuit in the related art is solved and system driving capacity is improved. ESD shocks and injuries are eliminated during manufacturing the VT circuit. In the related art, it is necessary to supply control timing via the thin film transistors for visual testing, and control signals are supplied to enable the thin film transistors in the VT circuit to be turned off during normal display after the array substrate forms an assembly. In embodiments of the present disclosure, the control is easy as no specific driving timing is designed.

DETAILED DESCRIPTION

The present disclosure will be further described in detail with reference to the accompanying drawings and embodiments. It is to be understood that the embodiments set forth below are intended to explain and not to limit the present disclosure. For ease of description, only a part related to the present disclosure rather than the whole structure is illustrated in the accompanying drawings.

Figure 1:
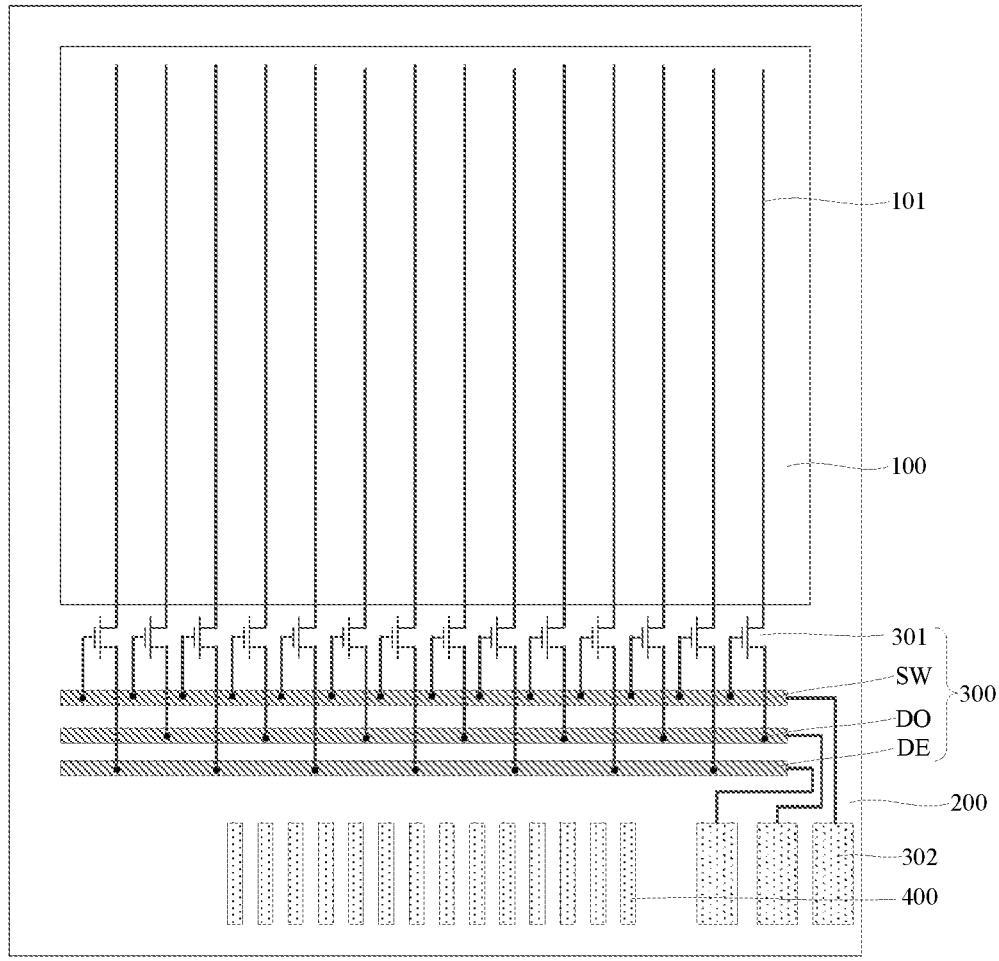
FIG. 1 is a schematic structural diagram of a display panel in the related art.
Figure 2A:
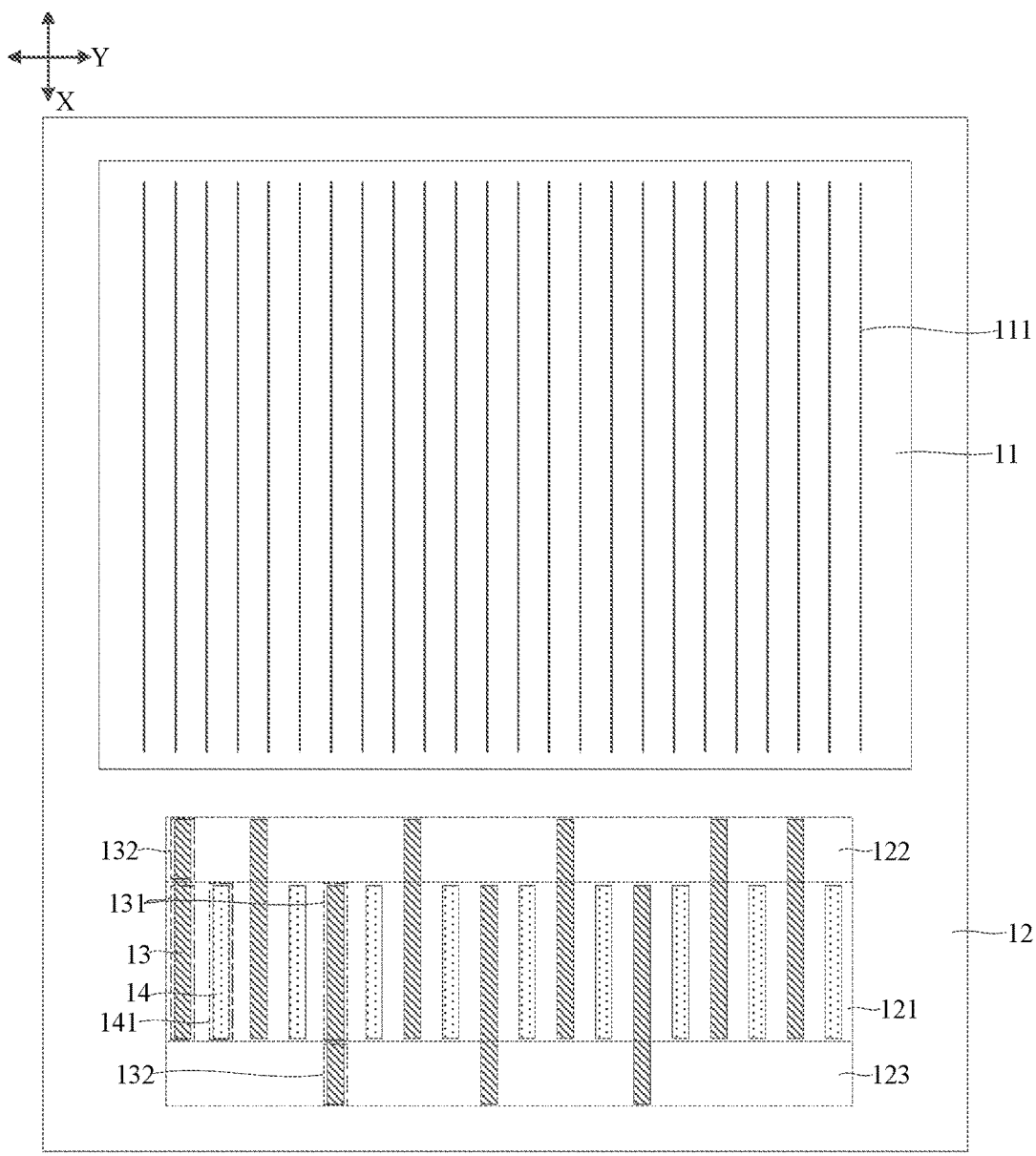
FIG. 2A is a schematic structural diagram of an array substrate according to an embodiment of the present disclosure.

FIG. 2A is a structural diagram of an array substrate according to an embodiment of the present disclosure. Referring to FIG. 2A, the array substrate includes a plurality of display signal lines 111 disposed in a display area 11, and a plurality of first pads 13 and a plurality of second pads 14 disposed in a peripheral area 12 around the display area 11 and electrically connected to the respective plurality of display signal lines 111.

For example, the plurality of first pads 13 may be electrically connected to the plurality of display signal lines 111 in a one-to-one correspondence and the plurality of second pads 14 may be electrically connected to the plurality of display signal lines 111 in a one-to-one correspondence. Alternatively, each first pad 13 corresponds to at least two display signal lines 111 and is electrically connected to the corresponding at least two display signal lines 111 through a multiplexer (not shown); and each second pad 14 corresponds to at least two display signal lines 111 and is electrically connected to the corresponding at least two display signal lines 111 through a multiplexer.

The peripheral area 12 includes a primary area 121, a first test area 122 and a second test area 123. In a first direction X, the first test area 122 and the second test area 123 are disposed on two sides of the primary area 121 respectively. The first direction X may be an extension direction of the display signal lines 111. The first pad 13 includes a first primary part 131 and the second pad 14 includes a second primary part 141. The first primary parts 131 and the second primary parts 141 are disposed in the primary area 121 and are disposed alternately in a second direction Y. The first direction X is perpendicular to the second direction Y.

At least one of the first pads 13 further includes a first test part 132 and the first test parts 132 are disposed in the first test area 122 and the second test area 123.

It should be noted that, in FIG. 2A, the first test area 122 is disposed on one side which is closer to the display signal lines 111, of the primary area 121 and the second test area 123 is disposed on another side, farther from the display signal lines 111, of the primary area 121. Alternatively, the second test area 123 may be disposed on the side, closer to the display signal lines 111, of the primary area 121 and the first test area 122 may be disposed on the side, farther from the display signal lines 111, of the primary area 121.

In the embodiment of the present disclosure, when a display panel formed of the array substrate is subject to the visual testing, as illustrated in FIG. 2A, a test apparatus (e.g., test pads) may be pressed against the first test area 122 and the second test area 123 and brought into contact with the first test parts 132 in the first test area 122 and the first test parts 132 in the second test area 123 to short-circuit the first test parts 132 in the first test area 122 and the first test parts 132 in the second test area 123. Thus the first pads 13 are short-circuited. Display test signals are transmitted to the first test parts 132 through the test pads and display signal lines 111 corresponding to the first pads 13 are charged by short-circuited first test parts 132 to implement the visual testing for the display panel.

Figure 2B:
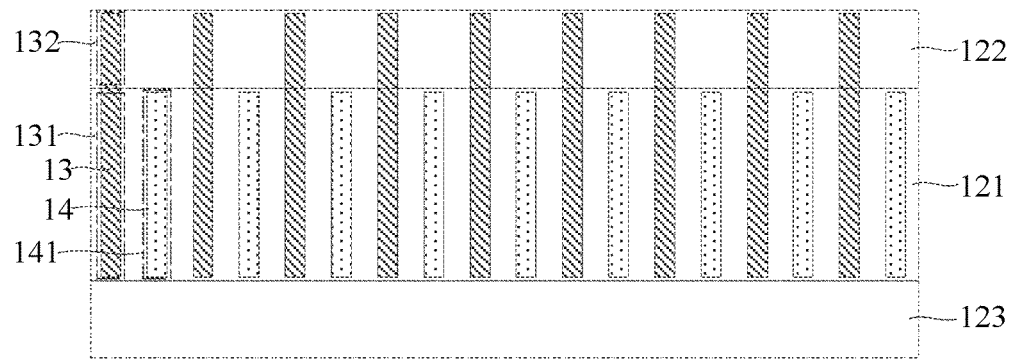
FIG. 2B is a schematic structural diagram of an array substrate border part according to an embodiment of the present disclosure.

Referring to FIG. 2B, FIG. 2B is a structural diagram of another array substrate according to an embodiment of the present disclosure. FIG. 2B only illustrates the border area structure of the first pads 13 and the second pads 14. In FIG. 2A, only the first pads 13 include first test parts 132 disposed in the first test area 122 and the second test area 123. Different from FIG. 2A, in FIG. 2B, the first test parts 132 of the first pads 13 are disposed only in the first test area 122.

That is, no first test part 132 of the first pads 13 is disposed in the second test area 123 and thus the second test area 123 may be omitted. In this way, space is saved in a first direction X on the array substrate, i.e., space is saved in an area covered by a lower border of the array substrate to achieve a narrow lower border.

Figure 2C:
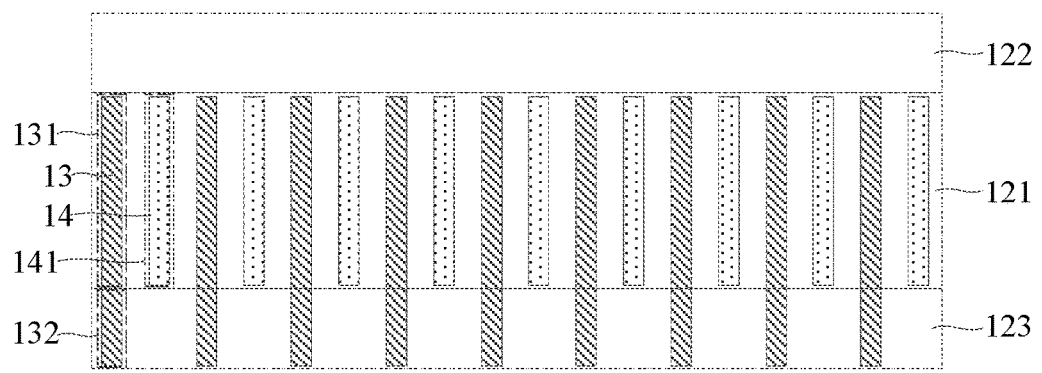
FIG. 2C is a schematic structural diagram of an array substrate border part according to an embodiment of the present disclosure.

FIG. 2C is a structural diagram of yet another array substrate according to an embodiment of the present disclosure. Similarities between FIG. 2A and FIG. 2C will not be repeated. Different from FIG. 2A, the first test parts 132 of the first pads 13 are disposed in only the second test area 123. The first test parts 132 of the first pads 13 are not disposed in the first test area 122 and thus the first test area 122 may be omitted. In this way, space is saved in a first direction X on the array substrate, i.e., space is saved in an area covered by a lower border of the array substrate to achieve a narrow lower border.

When a display panel formed of the array substrate illustrated in FIG. 2B or FIG. 2C is subject to the visual testing, a test apparatus is brought into contact with the first test area 122 (for the array substrate illustrated in FIG. 2B) to short-circuit the first test parts 132 of the first test area 122. The test apparatus is pressed against the second test area 123 (for the array substrate illustrated in FIG. 2C) to short-circuit the first test parts 132 of the second test area 123. Display test signals are transmitted to the first test parts 132 by the test apparatus, and then display signal lines corresponding to the respective first pads 13 are charged.

Figure 2D:
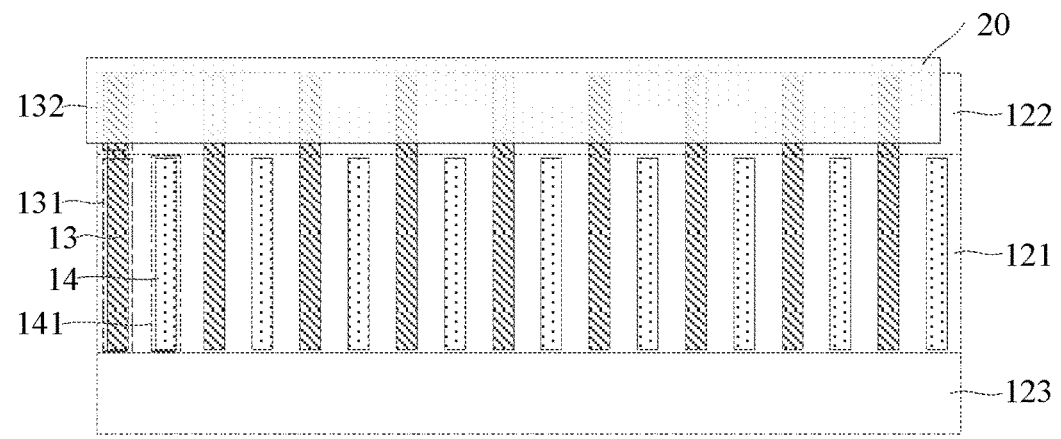
FIG. 2D is a schematic diagram illustrating a visual testing structure according to an embodiment of the present disclosure.
Figure 2E:
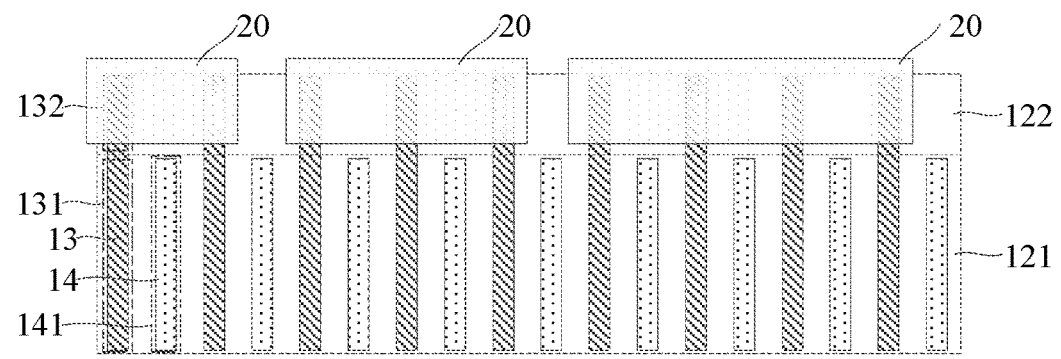
FIG. 2E is a schematic diagram illustrating another visual testing structure according to an embodiment of the present disclosure.

By way of example, referring to FIG. 2D, FIG. 2D is a schematic diagram illustrating the visual testing structure according to an embodiment of the present disclosure. A display panel formed of the array substrate illustrated in FIG. 2B may be subject to visual testing. Optionally, a test pad 20 of a test apparatus is used to cover the first test area 122 and is brought into contact with the first test parts 132 disposed in the first test area 122 to short-circuit the first test parts 132, and then display test signals of the test apparatus are transmitted to display signal lines 111 which correspond to and are connected to first pads 13 through the test pad 20 and the first test parts 132 of the first pads 13 to implement the visual testing. One test pad 20 is used by way of example in FIG. 2D. In other examples, multiple test pads 20 may be used. By way of example, referring to FIG. 2E, each test pad 20 may be brought into contact with at least one first test part 132 so that the first test parts 132 in contact with the test pad 20 are short-circuited through the test pad 20. When one test pad 20 is brought into contact with all the first test parts 132 and is used to charge the display signal lines 111 connected to the first pads 13, the VT charging capacity may be insufficient and may further cause color mixture. When multiple test pads 20 are used, the first test parts 132 are divided into multiple groups and each test pad 20 is in contact with one group of first test parts 132, thereby ensuring a sufficient capacity for charging the display signal lines 111 and thus improving VT reliability.

Figure 3:
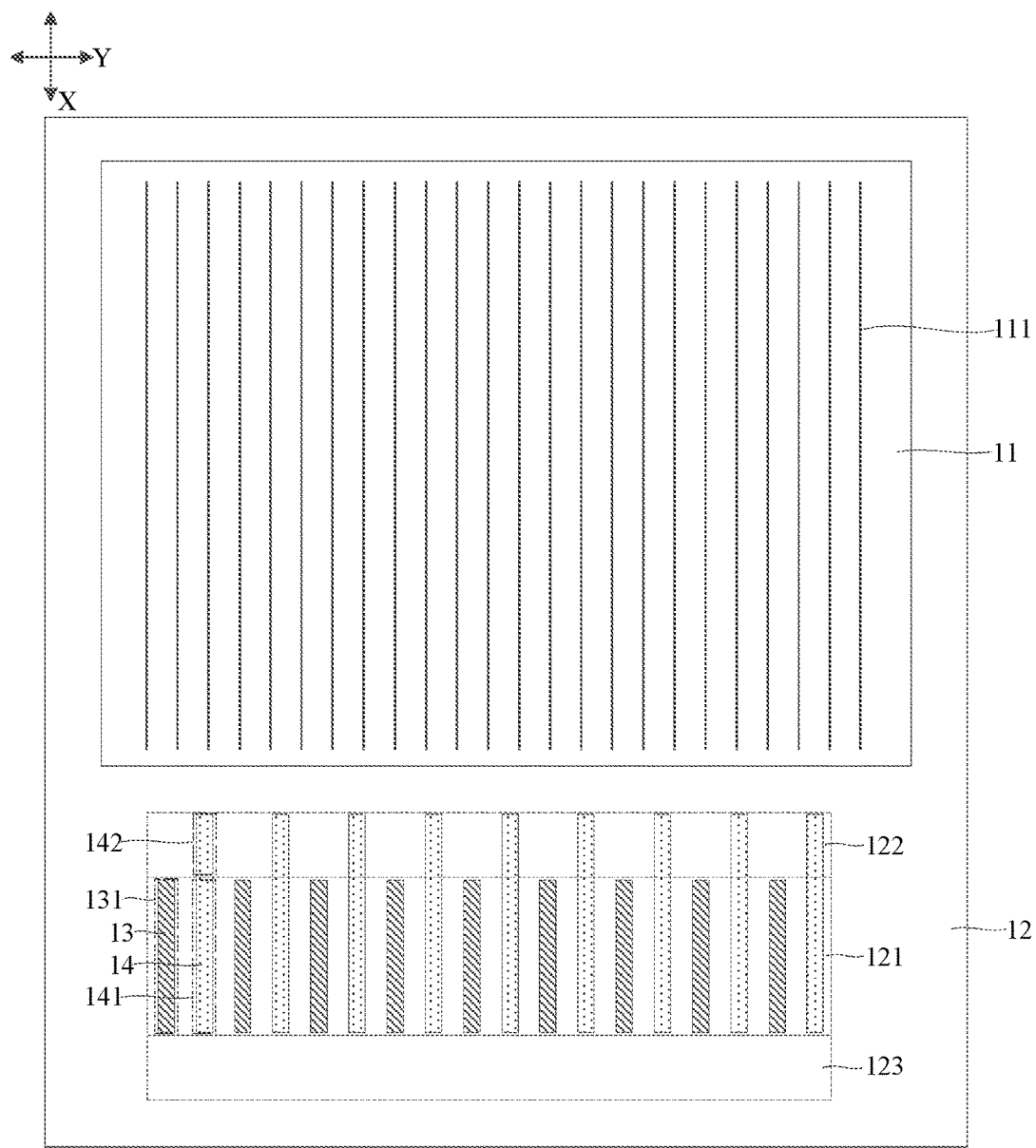
FIG. 3 is a schematic structural diagram of an array substrate according to an embodiment of the present disclosure.

FIG. 3 is a structural diagram of still another array substrate according to an embodiment of the present disclosure. The array substrate includes a plurality of display signal lines 111 disposed in a display area 11, and a plurality of first pads 13 and a plurality of second pads 14 disposed in a peripheral area 12 around the display area 11 and electrically connected to the respective plurality of display signal lines 111. For example, the plurality of first pads 13 and the plurality of second pads 14 may be electrically connected to the plurality of display signal lines 111 in a one-to-one correspondence manner. Alternatively, each first pad 13 corresponds to at least two display signal lines 111 and is electrically connected to the corresponding at least two display signal lines 111 through a multiplexer (not shown); and each second pad 14 corresponds to at least two display signal lines 111 and is electrically connected to the corresponding at least two display signal lines 111 through a multiplexer. The peripheral area 12 includes a primary area 121, a first test area 122 and a second test area 123. In a first direction X, the first test area 122 and the second test area 123 are disposed on two sides of the primary area 121 respectively. The first direction X may be an extension direction of the display signal lines 111. Each first pad 13 includes a first primary part 131 and each second pad 14 includes a second primary part 141. The first primary parts 131 and the second primary parts 141 are disposed in the primary area 121 and are disposed alternately in a second direction Y. The first direction X is perpendicular to the second direction Y. At least one of the second pads 14 further includes a second test part 142 and the second test part 142 is disposed in the first test area 122. In another embodiment, the second test parts 142 of the second pads 14 may be disposed in only the second test area 123. In yet another embodiment, the second test parts 142 of the second pads 14 may be disposed in the first test area 122 and the second test area 123, i.e., both the first test area 122 and the second test area 123 are provided with the second test parts 142.

Figure 4A:
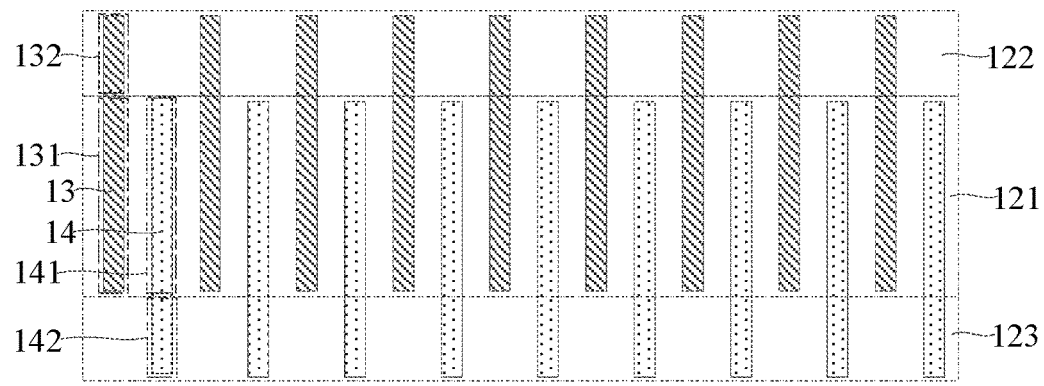
FIG. 4A is a schematic structural diagram of an array substrate border part according to an embodiment of the present disclosure.

In the above examples, the first pad 13 of the array substrate includes a first test part 132 or the second pad 14 of the array substrate includes a second test part 142. In other examples of the embodiment of the present disclosure, the first pad 13 of the array substrate includes a first test part 132 and the second pad 14 of the array substrate includes a second test part 142. By way of example, referring to FIG. 4A, FIG. 4A is a structural diagram of an additional array substrate according to an embodiment of the present disclosure. In the array substrate, at least one of the first pads 13 further includes a first test part 132 and at least one of the second pads 14 further includes a second test part 142. The first test part 132 is disposed in the first test area 122 and the second test part 142 is disposed in the second test area 123, or the first test part 132 is disposed in the second test area 123 and the second test part 142 is disposed in the first test area 122.

For the array substrate in the embodiment of the present disclosure, when a display panel formed of the array substrate illustrated in FIG. 4A is subject to visual testing, a test apparatus, e.g., a test pad is pressed against the first test area 122 and is brought into contact with the first test parts 132 in the first test area 122 to short-circuit the first test parts 132 disposed in the first test area 122, and then test signals are transmitted to display signal lines 111 corresponding to the first pads 13 by the short-circuited first pads 13; and another test pad is pressed against the second test area 123 and brought into contact with the second test parts 142 in the second test area 123 to short-circuit the second test parts 142 disposed in the second test area 123, and then test signals are transmitted to display signal lines 111 corresponding to the second pads 14 by the short-circuited second pads 14 to implement VT for the display panel.

In the related art, a first pad 13 includes only a first primary part 131 and a second pad 14 includes only a second primary part 141, and the first pads 13 and the second pads 14 are disposed alternately, so the first pads 13 or the second pads 14 cannot be short-circuited directly. In the technical solutions provided by embodiments of the present disclosure, structures of the first pads 13 and the second pads 14 are redesigned, and the visual testing of the display panel formed of the array substrate can be simply implemented through the first test parts 132 of the first pads 13 and the second test parts 142 of the second pads 14. No need to design DO signal lines, DE signal lines, SW signal lines or thin film transistors, the VT circuit is omitted, i.e., no VT circuit is required to dispose on the array substrate, so the circuit is omitted and power consumption is reduced. Space occupied by the VT circuit on the display panel is saved and a narrower lower border is achieved for the display panel. The problem of insufficient driving capacity is solved for the VT circuit in the related art and system driving capacity is improved. ESD shocks and injuries are eliminated during VT. In the related art, control timing is supplied to the thin film transistors for VT, and control signals are supplied to enable the thin film transistors in the VT circuit to be turned off during normal display after the array substrate forms an assembly. In embodiments of the present disclosure, the control is easy as no specific driving timing is designed.

It can be seen from the above embodiments that in the Y direction, a distance between two adjacent first test parts 132 is greater than a distance between a first primary part 131 and a second primary part 141 adjacent to each other, and a distance between two adjacent second test parts 142 is greater than the distance between a first primary part 131 and a second primary part 141 adjacent to each other. On the premise that the distance between two adjacent first test parts 132 or the distance between two adjacent second test parts 142 meets VT requirements, test probes may be brought into contact with the first test parts 132 and the second test parts 142. In this way, the display signal lines 111 connected to one first pad 13 and the display signal lines 111 connected to one second pad 14 are charged independently, and thus insufficiency of capacity for charging multiple display signal lines 111 simultaneously is eliminated.

In embodiments of the present disclosure, the first primary parts 131 and the second primary parts 141 may have the same shape. The first primary parts 131 and the second primary parts 141 are disposed alternately, the first pads 13 and the second pads 14 provide the same type of signals and are bonded to the same flexible printed circuit (FPC) or the same driver chip, so the same shape between the first primary parts 131 and the second primary parts 141 facilitates arrangement and design and facilitates the bonding to the FPC or the driver chip.

In embodiments of the present disclosure, the first primary part 131 and the first test part 132 of each first pad 13 are formed integrally, and the second primary part 141 and the second test part 142 of each second pad 14 are formed integrally. That is, a first metal layer may be formed on the array substrate and the first metal layer may be etched to form the first primary part 131 and the first test part 132 of each first pad 13, and a second metal layer may be formed on the array substrate and the second metal layer may be etched to form the second primary part 141 and the second test part 142 of each second pad 14. The first metal layer and the second metal layer may be the same metal layer.

The display signal lines 111 may be data signal lines. The first pads 13 may be connected to the respective odd-numbered data signal lines and the second pads 14 may be connected to the respective even-numbered data signal lines. Data signals are transmitted to the first pads 13 via the first test parts 132 of the first pads 13 for charging the odd-numbered data signal lines and data signals are transmitted to the second pads 14 via the second test parts 142 of the second pads 14 for charging the even-numbered data signal lines, then the visual testing is implemented.

When the array substrate forms an assembly, the FPC or the driver chip is bonded to the array substrate. For example, the FPC or the driver chip is bonded to the array substrate through the first pads 13 and the second pads 14. The first primary part 131 and the first test part 132 of the first pad 13 are both bonded to the FPC or the driver chip, and/or the second primary part 141 and the second test part 142 of the second pad 14 are both bonded to the flexible printed circuit or the driver chip. This increases the areas of the first pads 13 and the second pads 14 in contact with pads of the FPC or pads of the driver chip and enhances adhesive force of the bonded FPC or driver chip.

Figure 4B:
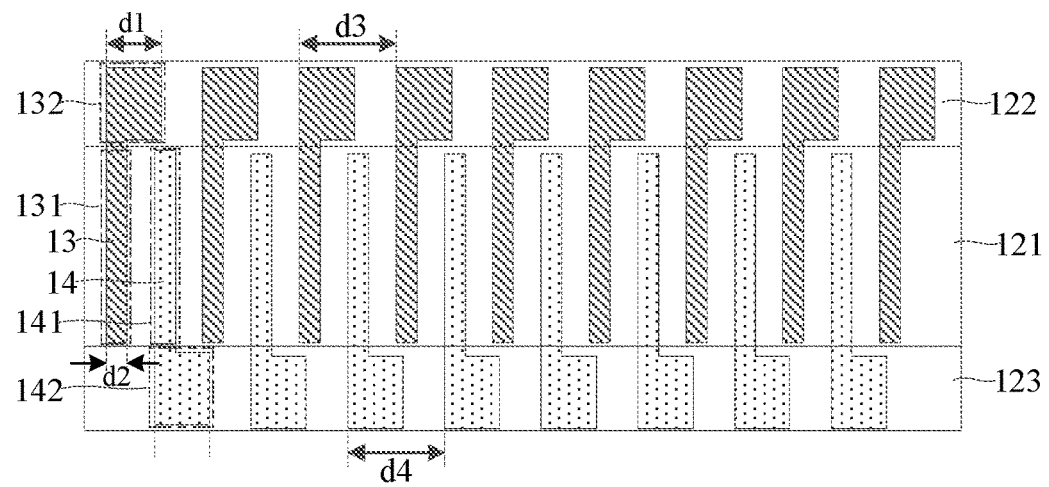
FIG. 4B is a schematic structural diagram of an array substrate border part according to an embodiment of the present disclosure.

FIG. 4B is a structural diagram of yet an additional array substrate according to an embodiment of the present disclosure. Referring to FIG. 4B, in the array substrate, each first pad 13 includes a first test part 132 and each second pad 14 includes a second test part 142. The first test parts 132 are disposed in a first test area 122 and are arranged in a second direction Y. The second test parts 142 are disposed in a second test area 123 and are arranged in the second direction Y. Referring to FIG. 4B, in the second direction Y, a width d1 of each first test part 132 may be greater than or equal to a width d2 of each first primary part 131 and a width of each second test part 142 may be greater than or equal to a width of each second primary part 141. During visual testing, the testing is usually configured. For example, a test pad is in contact with the first test parts 132 or the second test parts 142 and the width of the first test part 132 is greater than the width of the first primary part 131. When the test apparatus is in contact with the first test parts 132 or the second test parts 142, the areas of the first test parts 132 in contact with the test apparatus and the areas of the second test parts 142 in contact with the test apparatus are increased to prevent poor contact between the test apparatus and the first test parts 132 and poor contact between the test apparatus and the second test parts 142, thereby facilitating transmission of display test signals and ensuring test reliability for a display panel.

Referring to FIG. 4B, in the second direction Y, a sum d3 of the width of the first test part 132 and a distance between adjacent first test parts 132 is greater than or equal to 120 μm, and/or, a sum d4 of the width of the second test part 142 and a distance between adjacent second test parts 142 is greater than or equal to 120 μm. When the test pad is brought into contact with the first test parts 132 or the second test parts 142, it is similar to a configuration in which the test pad is temporarily bonded to the first test parts 132 and the second test parts 142 by an external force and the test pad is separated from the first test parts 132 and the second test parts 142 if the external force is withdrew. Based on existing bonding techniques, this bonding generally requires that a pitch between two adjacent pads (first test parts or second test parts), i.e., a sum of a width of a pad and a distance between two adjacent pads be greater than or equal to 120 μm so that electric signals can be transmitted effectively through the test pad and the first test parts 132 or the second test parts 142. It is to be understood by those skilled in the art that this is not intended to limit the first test parts 132 of the first pads 13 and the second test parts 142 of the second pads 14 in the present disclosure. When the existing dummy bonding techniques can meets that the pitch between two adjacent pads is less than 120 μm, the sum of the width of the first test part 132 and the distance between adjacent first test parts 132 may be less than 120 μm and the sum of the width of the second test part 142 and the distance between adjacent second test part 142 may be less than 120 μm in the embodiment of the present disclosure.

Figure 4C:
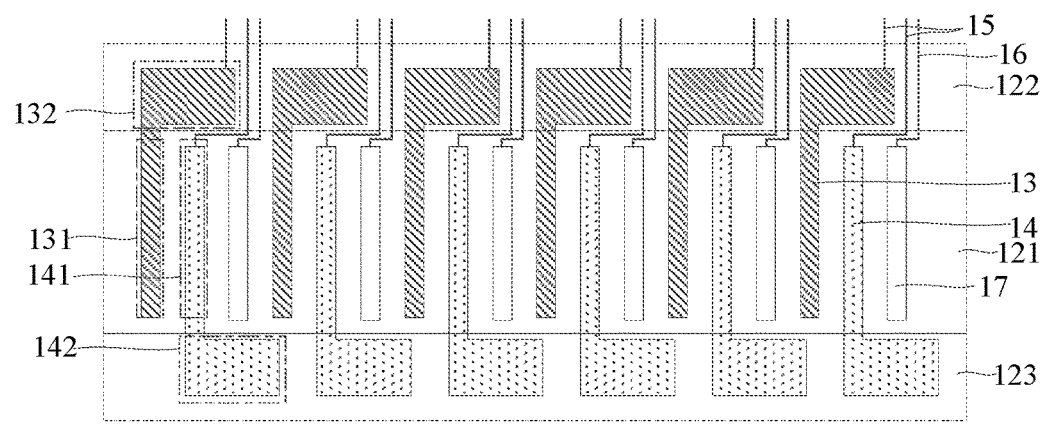
FIG. 4C is a schematic structural diagram of an array substrate border part according to an embodiment of the present disclosure.

FIG. 4C is a structural diagram of still an additional array substrate's border part according to an embodiment of the present disclosure. Referring to FIG. 4C, based on the preceding embodiments, the array substrate further includes a plurality of first connecting leads 15. The first pads 13 and the second pads 14 correspond to the first connecting leads 15 in a one-to-one correspondence manner, and are electrically connected to a corresponding display signal line 111 through a respective one of the plurality of first connecting leads 15. The first pad 13 may be electrically connected to the corresponding first connecting lead 15 through the first test part 132, and the second pad 14 may be electrically connected to the corresponding first connecting lead 15 through the second primary part 141. The first connecting lead 15 connected to the first pad 13 and the first connecting lead 15 connected to the second pad 14 may be disposed on the same layer or different layers.

Referring to FIG. 4C, based on the preceding embodiments, the array substrate further includes a plurality of third pads 17. The third pads 17 are disposed in a primary area 121 and are used for transmitting touch signals. The third pads 17 may be connected to touch electrodes on the array substrate, and touch signals are transmitted to the touch electrodes via the third pads 17. In a second direction Y, every first primary part 131 and second primary part 141 is provided with one third pad 17 (that is, every two adjacent ones of the plurality of third pads are spaced apart with a respective one of the plurality of first primary parts and a respective one of the plurality of second primary parts), and the one third pad 17 is disposed between one of the first pads 13 and one of the second pads 14. The third pad 17 is connected to a corresponding touch electrode through a corresponding second connecting lead 16. The array substrate is typically provided with multiple first connecting leads 15 and multiple second connecting leads 16. Each third pad 17 is disposed between a respective one first pad 13 and a respective one second pad 14. The first connecting leads 15 and the second connecting leads 16 may be disposed on different layers and insulated from each other, and may overlap with each other. Therefore, the first connecting leads 15 and the second connecting leads 16 may cover a smaller width on the array substrate to achieve a narrow border for the array substrate. The third pads 17 may have the same shape as the first primary parts 131 or the second primary parts 141.

Figure 4D:
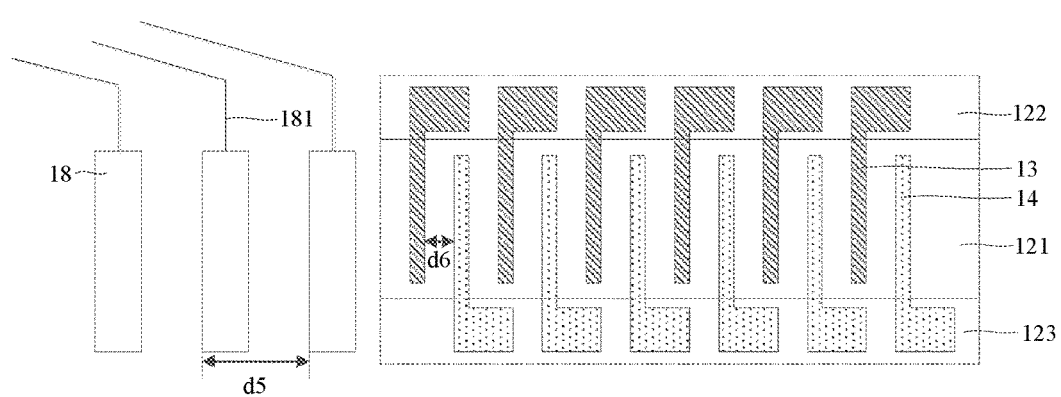
FIG. 4D is a schematic structural diagram of an array substrate border part according to an embodiment of the present disclosure.

FIG. 4D is a structural diagram of yet still an additional array substrate's border part according to an embodiment of the present disclosure. Referring to FIG. 4D, based on the preceding embodiment, the array substrate further includes a plurality of fourth pads 18. In a second direction Y, the fourth pads 18 are disposed on at least at one side of first pads 13 and second pads 14. The fourth pads 18 may be disposed on the left side of the first pads 13 and the second pads 14, may be disposed on the right side of the first pads 13 and the second pads 14 or may be disposed on both the left side and the right side of the first pads 13 and the second pads 14. A pitch distance d5 of two adjacent fourth pads 18 is greater than an outer edge to edge distance d6 between a first pad and a second pad adjacent to the first pad. Control signals, e.g., clock control signals, may be transmitted to the array substrate via the fourth pads 17. Third connecting leads 181 connected to the fourth pads 18 generally extend towards an edge of the array substrate. A segment of the third connecting lead 181 extending from a respective fourth pad 18 is in parallel with a first direction X. This segment occupies a length in the first direction X on the array substrate. Therefore, first test parts or second test parts disposed on the right side of this segment do not add an extra length in the first direction on the array substrate.

An embodiment of the present disclosure provides a display panel including the array substrate of any embodiment of the present disclosure.

An embodiment of the present disclosure provides a test method for a display panel. The display panel includes an array substrate including a plurality of display signal lines, a plurality of first pads and a plurality of second pads.

The display signal lines are disposed in a display area.

The first pads and the second pads are disposed in a peripheral area around the display area and are electrically connected to the respective display signal lines.

The peripheral area includes a primary area, a first test area and a second test area, the first test area and the second test area are disposed on two sides of the primary area in a first direction respectively. Each first pad includes a first primary part and each second pad includes a second primary part, the first primary parts and the second primary parts are disposed in the primary area and are disposed alternately in a second direction, and the first direction is perpendicular to the second direction.

At least one of the first pads further includes a first test part and the first test parts are disposed in the first test area and/or the second test area.

Alternatively, at least one of the second pads further includes a second test part and the second test parts are disposed in the first test area and/or the second test area.

Alternatively, at least one of the first pads further includes a first test part, at least one of the second pads further includes a second test part, the first test part is disposed in the first test area and the second test part is disposed in the second test area.

The test method includes: transmitting test signals to display signal lines connected to the first pads through the first test parts, and transmitting test signals to display signal lines connected to the second pads through the second test parts.

For example, the first test parts and the second test parts are brought into contact with a plurality of test probes respectively, the display signal line corresponding to a respective first pad is charged separately through a respective first test part, and the display signal line corresponding to a respective second pad is charged separately through a respective second test part. In this way, charging capacity during testing is improved.

Alternatively, a test pad is brought into contact with the first test parts to short-circuit the first test parts and then the display signal lines corresponding to the first pads are charged simultaneously, and another test pad is brought into contact with the second test parts to short-circuit the second test parts and then the display signal lines corresponding to the second pads are charged simultaneously.

The test method for a display panel provided by the embodiment of the present disclosure may be used to test the display panel of any embodiment of the present disclosure.

Optionally, at least two of the first test parts are short-circuited and then test signals are transmitted to the display signal lines connected to the first pad via the at least two shorted-circuited first test parts. For example, at least one first test pad may be brought into contact with the first test parts and then test signals are transmitted to the first test parts in contact with the at least one first test pad.

At least two of the second test parts are short-circuited and then test signals are transmitted to the display signal lines connected to the second pad via the at least two shorted-circuited second test parts. For example, at least one second test pad may be brought into contact with the second test parts and then test signals are transmitted to the second test parts in contact with the at least one second test pad.

Figure 5A:
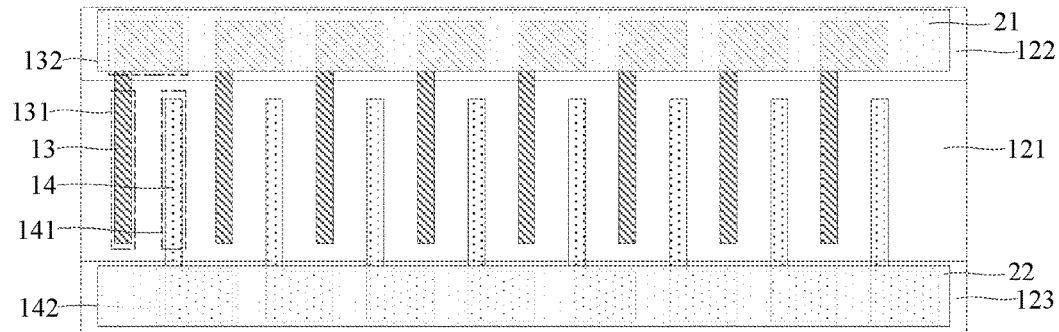
FIG. 5A is a schematic diagram illustrating yet another visual testing structure according to an embodiment of the present disclosure.

Exemplarily, referring to FIG. 5A, one first test pad 21 may be brought into contact with the one first test parts 132 (similar to dummy bonding) and display test signals are loaded to the first test parts 132 via the first test pad 21 and then display signal lines 111 connected to the first pad 13 are charged. One second test pad 22 may be brought into contact with the second test parts 142 and display test signals are loaded to the one second test parts 142 and then display signal lines 111 connected to the second pad 14 are charged. In this way, the visual testing is implemented for the display panel.

Figure 5B:
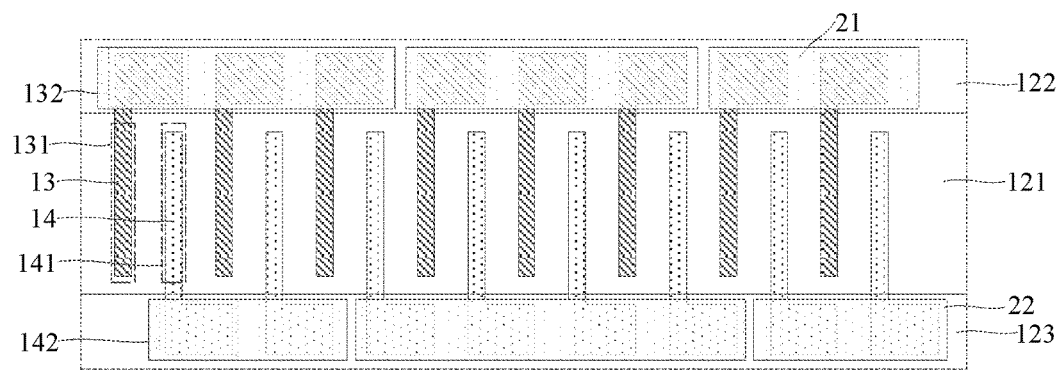
FIG. 5B is a schematic diagram illustrating still another visual testing structure according to an embodiment of the present disclosure.

Referring to FIG. 5B, two or more first test pads 21 may be used. The first test parts 132 are divided into multiple groups. Each group includes at least one first test part 132. Each first test pad 21 is brought into contact with a respective group of first test parts 132 and charges display signal liens 111 connected to first test parts 132 in the respective group. Two or more second test pads 22 may be used. The second test parts 142 are divided into multiple groups. Each group includes at least one second test part 142. Each second test pad 22 is brought into contact with a respective group of second test parts 42 and charges display signal liens 111 connected to second test parts 132 in the respective group. Charging in multiple groups eliminates color mixture caused by insufficiency of capacity for charging data lines during testing.

In the technical solutions provided by embodiments of the present disclosure, the test is implemented for the display panel simply through the first pads and the second pads. No VT circuit is required to design and the VT circuit is omitted, and thus a narrow lower border for the display panel is achieved. Insufficient driving capacity is solved for the VT circuit in the related art and system driving capacity is improved. ESD shocks and injuries are eliminated during VT. Furthermore, the control is easy during VT as no specific driving timing is required to be designed.

It is to be noted that the above are only preferred embodiments of the present disclosure and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. An array substrate, comprising:
a plurality of display signal lines disposed in a display area; and
a plurality of first pads and a plurality of second pads, both are disposed in a peripheral area around the display area and electrically connected to the respective display signal lines,
wherein the peripheral area comprises a primary area, a first test area and a second test area, wherein the first test area is disposed on a first side of the primary area and the second test area is disposed on the second side of the primary area, wherein the first side is opposite to the second side in a first direction, wherein each of the plurality of first pads comprises a first primary part and each of the plurality of second pads comprises a second primary part, wherein the first primary part and the second primary part are disposed in the primary area and are arranged alternately in a second direction perpendicular to the first direction; and
wherein each of at least one of the plurality of first pads further comprises a first test part disposed in one of the first test area and the second test area, or
each of at least one of the plurality of second pads further comprises a second test part disposed in one of the first test area and the second test area, or
each of at least one of the plurality of first pads further comprises a first test part disposed in the first test area, and each of at least one of the plurality of second pads further comprises a second test part disposed in the second test area.

2. The array substrate of claim 1, wherein the first primary part and the second primary part have a same shape.

3. The array substrate of claim 1, wherein in the second direction, a width of the first test part is greater than or equal to a width of the first primary part.

4. The array substrate of claim 1, wherein in the second direction, a width of the second test part is greater than or equal to a width of the second primary part.

5. The array substrate of claim 1, wherein each of the plurality of first pads further comprises the first test part and each of the plurality of second pads further comprises the second test part;
wherein the first test part is disposed in the first test area and arranged along the second direction; and
wherein the second test part is disposed in the second test area and arranged along the second direction.

6. The array substrate of claim 5, wherein in the second direction, a sum of a width of the first test part and a distance between two adjacent first test parts is greater than or equal to 120 μm.

7. The array substrate of claim 5, wherein in the second direction, a sum of a width of the second test part and a distance between two adjacent second test parts is greater than or equal to 120 μm.

8. The array substrate of claim 1, further comprising a plurality of first connecting leads, wherein the plurality of first pads and the plurality of second pads are electrically connected to the plurality of first connecting leads in an one-to-one correspondence manner, and are electrically connected to the plurality of display signal lines through the plurality of first connecting leads; and
wherein each of the plurality of first pads is electrically connected to the corresponding one of the plurality of first connecting leads through the first test part, and each of the plurality of second pads is electrically connected to the corresponding one of the plurality of first connecting leads through the second primary part.

9. The array substrate of claim 1, further comprising a plurality of third pads, disposed in the primary area and used for transmitting touch signals; wherein in the second direction, every two adjacent third pads are spaced apart by one of the plurality of first primary parts and one of the plurality of second primary parts.

10. The array substrate of claim 9, wherein the plurality of third pads each has a same shape as the plurality of first primary parts each or the plurality of the second primary parts each.

11. The array substrate of claim 1, further comprising a plurality of fourth pads, wherein in the second direction, the plurality of fourth pads are disposed on at least one side of the plurality of first pads or the plurality of second pads; and wherein a pitch distance between two adjacent ones of the plurality of fourth pads is greater than a distance between two adjacent first pad and second pad.

12. The array substrate of claim 1, wherein the first primary part and the first test part of each of the plurality of first pads are both bonded to a flexible printed circuit board or a driver chip, and/or wherein the second primary part and the second test part of each of the plurality of second pads are both bonded to the flexible printed circuit board or the driver chip.

13. The array substrate of claim 1, wherein the first primary part and the first test part of each of the plurality of first pads are formed integrally, and the second primary part and the second test part of each of the plurality of second pads are formed integrally.

14. The array substrate of claim 1, wherein the plurality of display signal lines are data signal lines.

15. The array substrate of claim 14, wherein each of the plurality of first pads is electrically connected to a respective odd-numbered data signal line, and each of the plurality of second pads is electrically connected to a respective even-numbered data signal line.

16. A display panel, comprising an array substrate, wherein the array substrate comprises:
a plurality of display signal lines disposed in a display area; and
a plurality of first pads and a plurality of second pads, which are disposed in a peripheral area around the display area and electrically connected to the respective display signal lines,
wherein the peripheral area comprises a primary area, a first test area and a second test area, wherein the first test area is disposed on a first side of the primary area and the second test area is disposed on the second side of the primary area, wherein the first side is opposite to the second side in a first direction, wherein each of the plurality of first pads comprises a first primary part and each of the plurality of second pads comprises a second primary part, wherein the first primary part and the second primary part are disposed in the primary area and are arranged alternately in a second direction perpendicular to the first direction; and
wherein each of at least one of the plurality of first pads further comprises a first test part disposed in one of the first test area and the second test area, or
each of at least one of the plurality of second pads further comprises a second test part disposed in one of the first test area and the second test area, or
each of at least one of the plurality of first pads further comprises a first test part disposed in the first test area, and each of at least one of the plurality of second pads further comprises a second test part disposed in the second test area.

17. A test method for a display panel in claim 16, comprising:
transmitting test signals to a plurality of first display signal lines each connected to one of the plurality of first pads through one of the first test parts, and
transmitting test signals to a plurality of second display signal lines each connected to one of the plurality of second pads through one of the second test parts.

18. The test method of claim 17, further comprising:
short-circuiting at least two of the first test parts, and transmitting test signals to the plurality of first display signal lines connected to respective first pads with shorted-circuited first test pads of the plurality of first pads through the at least two first test parts; and
short-circuiting at least two of the second test parts, and transmitting test signals to the plurality of second display signal lines connected to respective second pads having said second test parts.

19. The test method of claim 17, further comprising:
bringing at least one first test pad into contact with the first test parts, and transmitting test signals through the at least one first test pad to the first test parts in contact with the at least one first test pad; and
bringing at least one second test pad into contact with the second test parts, and transmitting test signals through the at least one second test pad to the second test parts in contact with the at least one second test pad.

* * * * *